United States Patent [19]
Bitts

[11] Patent Number: 6,114,856
[45] Date of Patent: Sep. 5, 2000

[54] METHOD FOR DETECTING FAULTS IN ELECTRICAL CIRCUITS HAVING PIN TYPE CONNECTOR

[75] Inventor: Donald R. Bitts, Grand Prairie, Tex.

[73] Assignee: Benz Companies, Inc., Fort Worth, Tex.

[21] Appl. No.: 09/067,841

[22] Filed: Apr. 27, 1998

[51] Int. Cl.$^7$ .......................... G01R 31/08; H01R 25/00; G08B 21/00
[52] U.S. Cl. .......................... 324/522; 324/512; 439/638; 340/652
[58] Field of Search .................................. 324/522, 523, 324/500, 512, 538, 537, 556, 542, 503; 340/654, 652, 687; 439/638

[56] References Cited

U.S. PATENT DOCUMENTS

| | | | |
|---|---|---|---|
| 4,278,931 | 7/1981 | Huggins | 324/523 |
| 4,494,092 | 1/1985 | Griffin | 333/182 |
| 4,764,727 | 8/1988 | McConchie, Sr. | 324/503 |
| 4,845,435 | 7/1989 | Bohan, Jr. | 324/537 |
| 4,867,706 | 9/1989 | Tang | 439/620 |
| 4,929,196 | 5/1990 | Ponn et al. | 439/620 |
| 4,932,900 | 6/1990 | Gliha | 439/608 |
| 4,934,960 | 6/1990 | Capp et al. | 439/620 |
| 5,011,434 | 4/1991 | Blunt | 439/620 |
| 5,250,909 | 10/1993 | Bitts | 324/542 |
| 5,431,584 | 7/1995 | Ferry | 439/620 |
| 5,583,441 | 12/1996 | Bitts | 324/553 |
| 5,686,697 | 11/1997 | Miller et al. | 174/52.2 |
| 5,742,234 | 4/1998 | Owen | 340/631 |

*Primary Examiner*—Safet Metjahic
*Assistant Examiner*—Anjan K Deb
*Attorney, Agent, or Firm*—Geoffrey A. Mantooth

[57] ABSTRACT

An open circuit sensor is connected to a monitoring circuit via a pin type connector. The monitoring circuit detects any change in continuity, caused by a change in the sensor. Also, a resistive device is located across the pins in the connector. The resistive device is located in a flexible medium, which medium is easily inserted over the pins in the connector. The monitoring circuit provides a leakage current through the resistive device and detects any change in that current in order to monitor the circuit for faults, such as a broken or degraded wire. The monitoring circuit can having plural pin type connectors, with each connector having a resistive device in a flexible medium located therein. The location of an open circuit fault can then be detected relative to the adjacent connectors.

11 Claims, 5 Drawing Sheets

METHOD FOR DETECTING FAULTS IN ELECTRICAL CIRCUITS HAVING PIN TYPE CONNECTOR

FIELD OF THE INVENTION

The present invention relates to diagnosing electrical circuits having sensors and pin type connectors.

BACKGROUND OF THE INVENTION

Normally open sensors are used in a variety of situations to provide status information of components. For example, in a helicopter, a normally open sensor closes an electrical circuit when the sensor is activated. The electrical circuit is connected to an indicator, such as a warning light on the pilot's instrument panel in the cockpit. The sensor is typically located remote from the instrument panel. Consequently, the sensor is connected to the indicator panel by wires, connectors, etc. Any element along this path could experience an electrical fault. Because the sensor is normally an open circuit, detection of a fault has been difficult.

An example of a normally open sensor is a chip detector. A chip detector is used to monitor the health or air worthiness of a helicopter's transmission or gear box, which is a vital piece of equipment. The presence of a significant number of metal chips in the transmission fluid usually indicates mechanical problems with the transmission. The chip detector is partially immersed in the transmission fluid so as to be exposed to the metal chips circulating inside of the fluid. The chip detector is provided with a magnet so as to attract and retain the metal chips. The presence or absence of metal chips captured by the chip detector is indicated both visually and electrically. The electrical indication is provided by a warning light on the instrument panel. If metal chips accumulate during flight, the warning light is illuminated and the pilot can safely land the helicopter, before the rotors lock up. However, if the circuit between the chip detector and the instrument panel experiences a fault, detection is made difficult by the open circuited nature of the detector. The visual indication occurs when the chip detector is pulled from its hole in the transmission. accumulation of metal chips can be seen.

U.S. Pat. Nos. 5,250,909 and 5,583,441 show an apparatus for detecting faults in electrical circuits containing normally open devices such as chip detector. The chip detector is provided with a resistive device across the open circuit. The resistive device provides a path for current through the electrical circuit. The continuity of the circuit can be monitored, without interfering with the sensing function of the chip detector.

The resistive device is a discrete component, such as a resistor, that is added to the chip detector during the manufacture of the chip detector. For example, the resistor can be located adjacent to the contacts. This involves electrically connecting the conductive leads of the resistor to the contacts. Alternatively, the resistor can be located inside of the chip detector housing. Such methods of installing a resistor in a chip detector are sometimes laborious. In addition, if the chip detector is utilized on an aircraft, then modifying the chip detector with the resistor requires qualification by regulatory authorities.

It is desirable to provide this diagnostic capability in an inexpensive and simple manner.

In addition, wiring harnesses in aircraft can be especially difficult to access for inspection. If there is a fault along the wiring harness, it is helpful to locate that fault. For example, locating the fault could place it between two bulkheads. If the circuit is not critical, or if the fault is located away from a critical item (for example, a fuel tank), then the circuit can be switched off and the aircraft maintained in service.

In the prior art, there are devices that, once connected to the wires, locate faults. However, these devices necessitate taking the circuit out of service. Such testing must be done on the ground during aircraft maintenance. It is desirable to provide fault location capabilities in real time, as the aircraft is in service.

SUMMARY OF THE INVENTION

It is an object of the present invention to provide diagnostic capability for a sensing circuit in an inexpensive and simple manner.

It is a further object of the present invention to determine the location of a fault in a sensing circuit.

The present invention provides a method of detecting faults in an electrical sensing circuit. The electrical sensing circuit comprises circuit conductors, with the circuit conductors having first and second ends. The electrical circuit also comprises a sensor located at the first end of the circuit conductors and a connector located along the circuit conductors near the sensor. The connector has connector conductors therein which connector conductors are electrically continuous with the circuit conductors. At least one of the connector conductors comprises a pin. The sensor is a normally open type. The method provides a leakage current between the connector conductors. The leakage current is monitored through the connector conductors from the second end of the circuit conductors. A change in the leakage current is detected, and if changed, then an indicator is driven.

In accordance with one aspect of the present invention, the step of detecting if there is a change in the leakage current further comprises detecting if the leakage current decreases. If so, then the step of driving an indicator further comprises the step of driving an open fault indicator.

In accordance with another aspect of the present invention, the step of providing a leakage current between the connector conductors further comprises providing a resistance contained in an elastomeric medium. The medium is located inside of a shell cavity of the connector, with the pin extending through the medium at a location that makes electrical contact with the resistance.

In accordance with another aspect of the present invention, the connector comprises two pins, with the leakage current being between the two pins. The two pins are electrically continuous with the respective circuit conductors.

In accordance with still another aspect of the present invention, the sensor comprises a chip detector.

The present invention is particularly useful for monitoring normally open sensors circuits in aircraft, where wiring can be difficult to inspect. The insert provides an inexpensive and simple way to monitor the circuit continuity from the detector, which is typically in the cockpit, all the way to the sensor, which is typically remotely located relative to the cockpit. Many sensors are equipped with pin type connectors to enable the sensors to be connected to a wiring harness. The monitoring circuit can be easily retrofitted by locating the insert within the pin type connector. The eliminates the need to open the wiring or to replace the sensor in order to provide monitoring of circuit continuity. The leakage current is monitored by way of voltage sensitive comparators.

DESCRIPTION OF THE PREFERRED EMBODIMENT

Figures 1, 4:
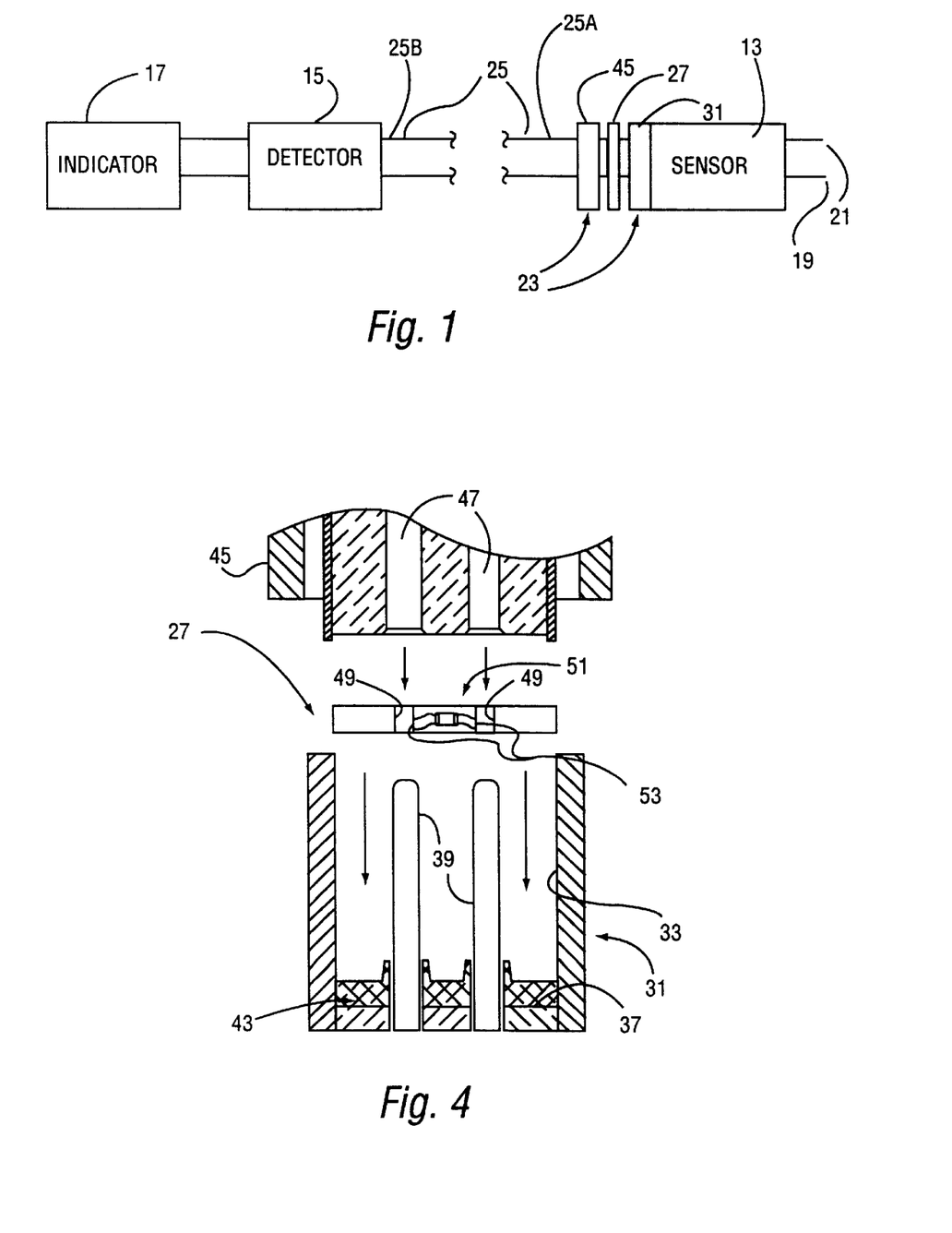
FIG. 1 is a block diagram, showing the various components of the sensing circuit of the present invention, in accordance with a preferred embodiment.
FIG. 4 is a detail longitudinal cross-sectional view of the connector assembly and the insert.

In FIG. 1, there is shown a block diagram of a sensing circuit 11 of the present invention. The sensing circuit is used to sense various conditions. For example, the sensing circuit can be used to sense metallic chips in a transmission system of a vehicle, such as a helicopter. Another example is the sensing of an open door in a helicopter. Such a sensing circuit is shown and described in my earlier U.S. Pat. Nos. 5,250,909 and 5,583,441.

The sensing circuit 11 has a sensor 13, a detector 15, and an indicator 17. Conductors in a wire harness 25 connect the sensor to the detector. The conductors have a first end 25A and a second end 25B. The sensor 13 is located at the first end 25A of the conductors, while the detector 15 is located at the second end 25B.

The sensor 13 is a normally open device, having first and second contacts 19, 21. Under normal operating circumstances, there is little or no continuity between the first and second contacts. Continuity is provided between the first and second contacts when the sensor is subjected to changed circumstances. The sensor 13 is connected to the detector 15, which detects the change in continuity between the first and second contacts. Upon a change in continuity, the indicator 17, which is connected to the detector 15, is changed.

The sensor 13 is connected to the detector 15 by way of a pin type connector assembly 23 and a wire harness 25. In order to test the operability of the normally open circuit, an insert 27 that contains a resistive device is located in the connector 23 adjacent to the sensor. The resistive device is electrically connected across the normally open circuit, so as to provide for continuity. A small amount of current passes through the resistive device, wherein the operability of the circuit can be assessed, even when in the normally open mode.

Figure 2:
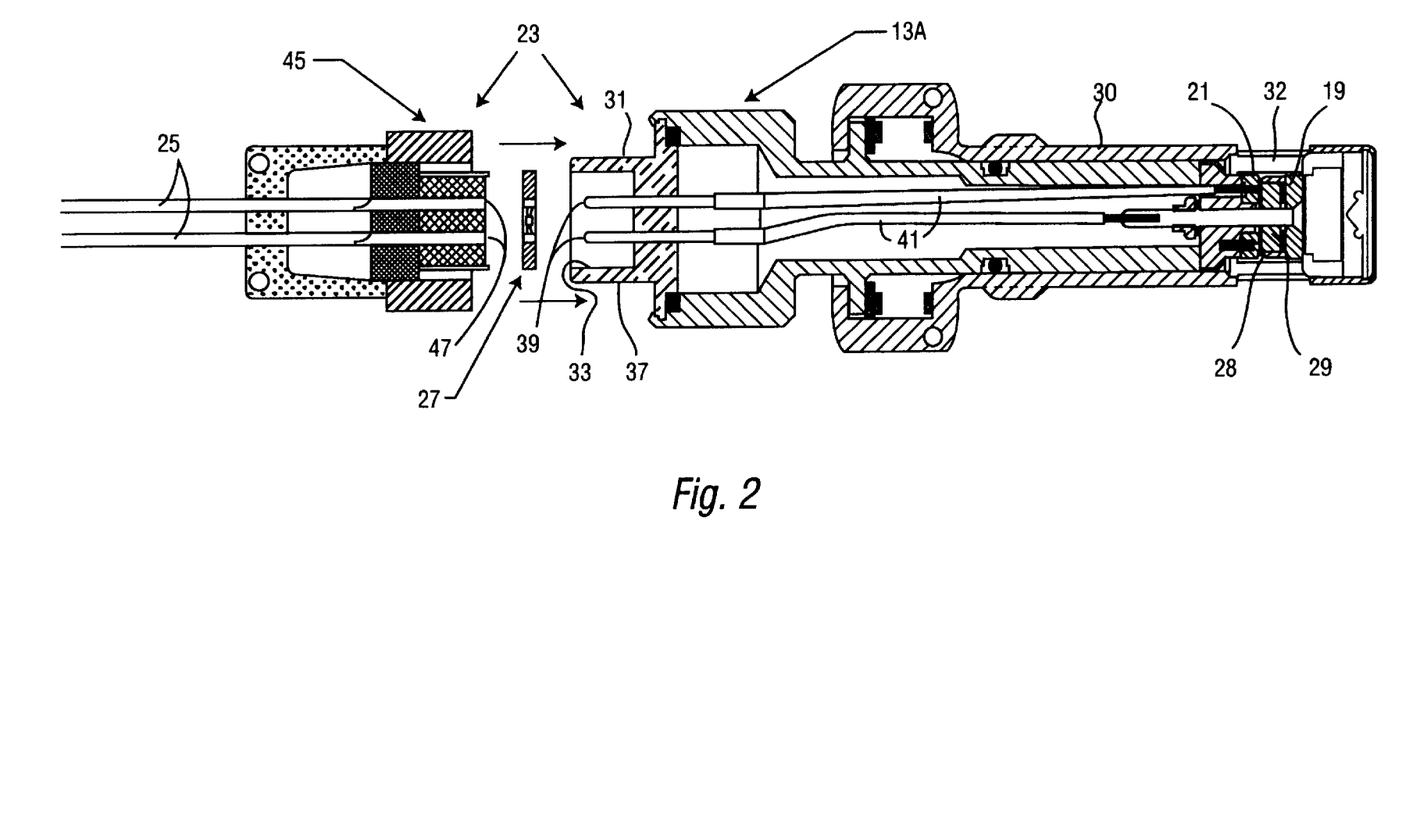
FIG. 2 is an exploded longitudinal cross-sectional view of a chip detector and wiring harness, showing the insert.
Figure 3:
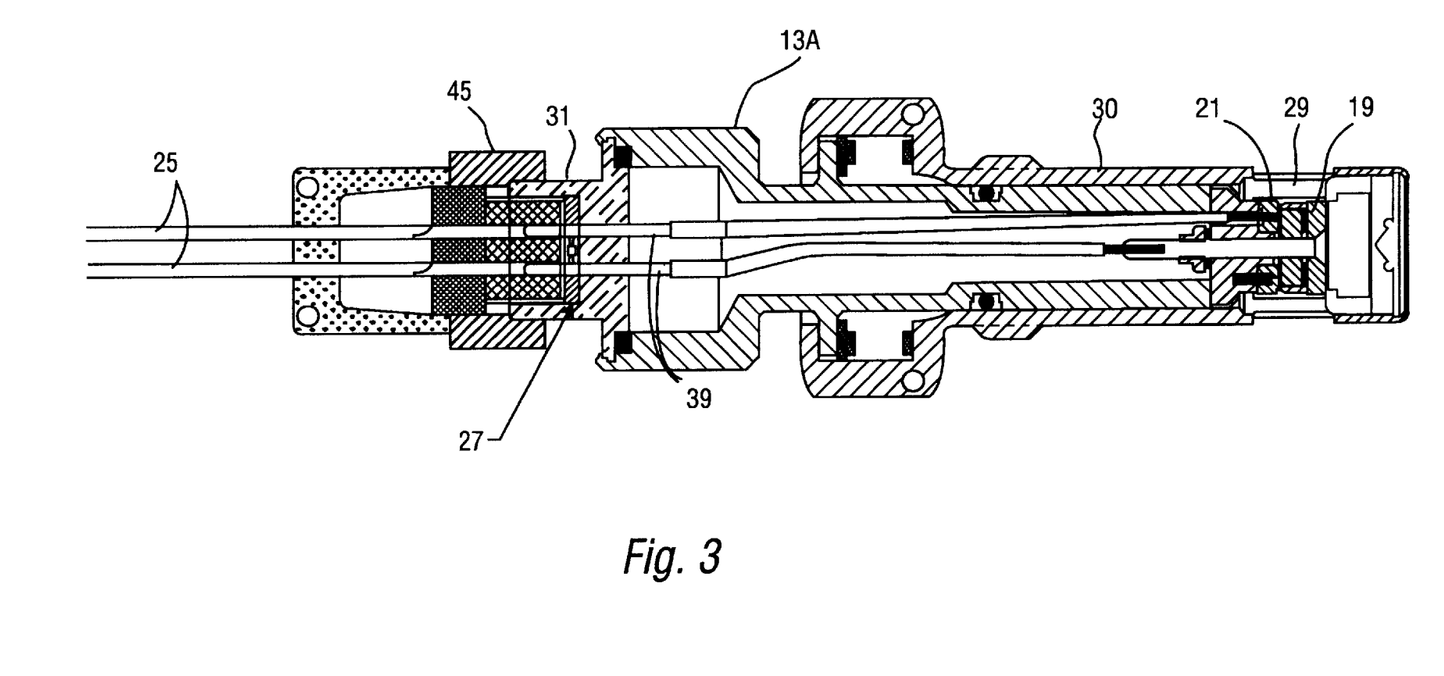
FIG. 3 is a longitudinal cross-sectional view of the chip detector, wiring harness and insert of FIG. 2, shown assembled.

In FIGS. 2 and 3, the sensor 13 is a chip detector 13A. One end of the chip detector 13A has two contacts 19, 21. The contacts 19, 21 are separated from each other by a gap. In between the contacts is a magnet 29, which attracts chips circulating in a transmission system. (In the embodiment shown in FIG. 2, the magnet 29 is protected by a sleeve 28.) The chips accumulate on the magnet and bridge the gap between the contacts, thereby causing continuity. The contacts can be as shown in U.S. Pat. No. 5,583,441.

The chip detector 13A is shown in conjunction with a self closing valve 30, which extends from a wall in the transmission into the transmission fluid. The valve 30 has a cylindrical body with ports 32 therein, to allow chips in the fluid to be captured by the magnet 29.

The other end of the chip detector 13A has a pin type of connector 31. The connector 31 has a plug shell that forms a cavity 33. The cavity 33 has an open end 35 and a closed end 37. Pins 39 extend into the cavity 33 from the closed end 37 toward the open end 35. The pins 39, which are electrically conductive, are electrically connected to the contacts 19, 21 by way of wires 41. There is a plug seal 43 (see FIG. 4) that is pushed down into the cavity against the closed end. The plug seal has openings therein for receiving the pins. The plug seal is elastomeric and provides an environmental seal at the closed end 37 of the cavity 33.

The pin connector 31 mates with a mating receptacle 45 to form the connector assembly 23. The mating receptacle 45 has openings 47 therein for receiving the pins 39. The openings 47 have electrical conductors that contact the respective pins. The mating receptacle 45 couples to the connector 31 either with a thread arrangement or a pin and slot arrangement. The connector assembly 23 is conventional and commercially available.

When the connector assembly 23 is assembled, there is electrical continuity between the respective first and second contacts 19, 21 and the detector 15, via the wire 25, the connector pins 39, and the conductors located in the mating receptacle pin openings 47.

In between the mating receptacle 45 and the connector 31 is the insert 27. The insert 27 is an elastomeric wafer. The wafer is shown and described in U.S. Pat. No. 5,686,697, the disclosure of which is incorporated herein. The wafer has a small thickness so as not to interfere with the coupling of the mating receptacle 45 to the connector 31. The wafer has a shape that conforms to the shell cavity 33 shape. For instance, if the shell cavity is circular, then the wafer is circular, having a diameter that is the same as that of the cavity. The insert 27 has openings 49 therethrough, which individual openings receive the respective pins 39.

A resistive device 51 is located in the insert 27. The resistive device 51 can be, for example, a resistor or a diode. The resistive device 51 provides a path for energy to flow through the circuit 11, even when the sensor 13 is open. The resistive device 51 is contained in an elastomeric matrix or medium, which medium makes up the remainder of the insert. The resistive device 51 is connected between the pin openings 49 by conductors 53. The conductors extend to each opening 49, such that when a pin 39 is inserted through the opening 49, electrical contact is made between the pin and the resistive device. The diameter of the insert openings can be smaller than the outside diameter of the pins, to ensure a good fit around the pins.

The insert 27 is inserted all the way into the shell cavity 33 so as to contact the seal 37. When inserted, there is continuity across the resistive device 51 between the two pins 39.

The resistive device 51 is chosen to provide a relatively large resistance through the sensing circuit, so as not to interfere with the normally open function of the sensor 13. The resistive device can range from 10K ohms to 1M ohms. In the preferred embodiment, a 100K ohm resistor is used to provide a current of 50–100 microamps through the circuit. The resistor is a chip type of resistor, which is formed by etching, or scribing a substrate material. If the resistive device is a diode, biasing circuitry is provided to reverse bias the diode and thus provide a relatively large resistance between the two pins.

Some sensors are single wire devices, wherein a ground is established through the housing of the sensor. In such a device, the resistive device 51 is connected between the pin and the inside diameter of the cavity 33. The connector 31 is connected to ground.

After the insert 27 is installed into the connector 31, the mating receptacle 45 is coupled into place on the connector 31. The mating receptacle 45 is removably coupled to the connector 31. The mating receptacle 45 is coupled to the wire harness 25 that extends to the detector circuit 15.

Figure 5:
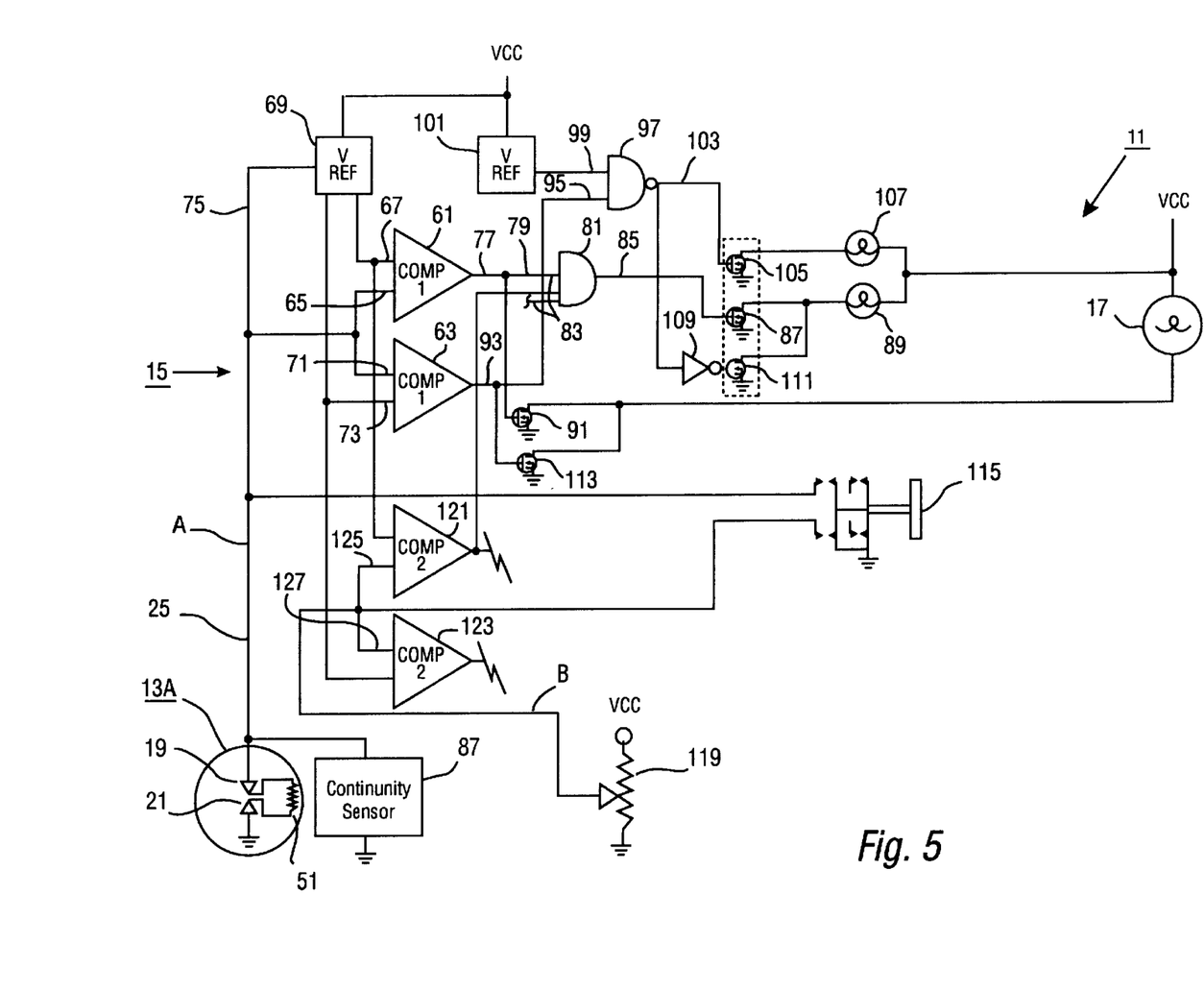
FIG. 5 is an electrical schematic diagram showing the detector circuit of the present invention.

FIG. 5 is a schematic diagram of the electrical circuit, showing in detail the detector 15. Also shown is the interconnection of the detector 15 with the sensor 13 and the indicator 17. The indicator is shown as a warning light 17. The circuit that is shown is for a single pin chip detector. The circuit is completed through the chip detector via ground, by way of the chip detector metal housing. With this type of chip detector, it is possible to detect if the chip detector has become disconnected from the transmission, because circuit continuity through ground is lost.

The chip detector 13A is connected via the detector 15 to the warning light 17 located inside of the instrument panel in the cockpit of a helicopter. The warning light 17 is connected to a supply voltage Vcc. When the detector electronics and/or the chip detector 13A complete the circuit to ground, the warning light 17 illuminates.

The detector provides comparators to detect a voltage level above or below a predetermined level. The detector can monitor plural channels A, B. Each channel has a high comparator 61 and a low comparator 63. Thus, for the chip detector channel A, the high comparator 61 has one input 65 connected to a tip contact 19 of the chip detector and the other input 67 connected to a reference voltage supply 69. The reference voltage supply 69 is connected to the supply voltage Vcc. The reference voltage input 67 into the high comparator 61 is set at a first predetermined level (e.g. 3–3.5 V). The low comparator 63 has one input 71 connected to the tip contact 19 of the chip detector and the other input 73 connected to the reference voltage supply 69. The reference voltage input 73 into the low comparator 63 is set at a second predetermined level (e.g. 0.7–1.5 V). The reference voltage supply 69 is also connected to the tip contact 19 through wires 75. This output on wires 75 of the reference voltage supply 69 provides a high voltage to the continuity sensor 87 (which will be explained below). The high voltage is provided through a voltage divider, which utilizes resistor 51. Thus, if chips close the chip detector circuit, the high voltage from wire 75 is pulled low.

The output 77 of the high comparator 61 is connected to one input 79 of an AND gate 81. The other inputs 83 of the AND gate 81 are connected to high comparator inputs from the other channels which service other sensors. The output 85 of the AND gate 81 is connected to the gate of a field effect transistor (FET) 87. The source and drain of the FET are connected to an amber light 89 and ground respectively. The amber light 89 is connected to the supply voltage Vcc. The output of the high comparator 61 is also connected to the gate of a FET 91, which is connected in series to the instrument panel warning light 17 for the chip detector.

The output 93 of the low comparator 63 is connected to one input 95 of a NAND gate 97. The other input 99 of the NAND gate 97 is connected to a reference voltage supply 101, which supplies a third predetermined level (e.g. 5 V) so as to produce a high input. The output 103 of the NAND gate 97 is connected to the gate of an FET 105 that drives a green light 107 by providing a connection to ground. The green light 107 is connected to the supply voltage Vcc. The output 103 of the NAND gate 97 is also connected to the input of an inverter 109. The output of the inverter 109 is connected to the gate of an FET 111 that drives the amber light 89 by providing a connection to ground. Thus, the amber light 89 is connected to two FETs 87, 111 that are connected to ground in parallel with each other. The output of the low comparator 63 is also connected to an FET 113 that drives the instrument panel warning light 17 by providing a connection to ground. Thus, the instrument panel warning light 17 is connected to two FETs 91, 113 that are respectively driven by the high and low comparators. The two FETs 91, 113 are connected to ground in parallel with each other.

There is also provided a press-to-test button 115 in the cockpit instrument panel. The press-to-test button 115 is normally open, but when pressed by a pilot, it provides a connection to ground for the tip contact input 65, 71 of the two comparators 61, 63. The green and amber lights 107, 89 may be physically located within the press-to-test button 115 so as to conserve instrument panel space.

There is also provided a continuity sensor 87 located adjacent to the chip detector 13A. The continuity sensor is connected across the chip detector contacts 19, 21. The construction and operation of the continuity sensor 87 is described in Berrier, et al., U.S. Pat. No. 5,045,840, the disclosure of which is herein incorporated by reference. The continuity sensor 87 provides continuity across a chip detector whenever power is applied to the wire 25. Power is applied to the wire 25 by the high voltage on wire 75, wherein the circuit 11 is powered up. The continuity sensor 87 maintains continuity for a predetermined amount of time (e.g. 5–10 seconds), and then breaks continuity.

The circuit 11 of the present invention can service plural channels, with each channel having a sensor. As exemplified in FIG. 5, a first channel A is connected to the open circuit chip detector 13. A second channel B is connected to a sensor 119 that uses a potentiometer. The second channel contains its own high and low comparators 121, 123, a NAND gate (not shown) and two FETs (not shown) for driving the respective instrument panel warning light (not shown). These electronic components of the second channel B are substantially similar in configuration to the electronic components of the first channel A. The outputs of the comparators are connected to the same FETs that drive the green and amber lights 107, 89. Thus, the green and amber lights 107, 89 and their FET drivers 87, 105, 111 are common to all channels. In addition, the AND gate 81 is common to all channels. The press-to-test button 115 is also connected to the non-voltage reference inputs 125, 127 of the comparators 121, 123.

With sensor 119, unlike the chip detector 13, a path to ground through the potentiometer is already provided. The reference voltage as provided to the high and low comparators 121, 123 can be the same as in the first channel A, as shown in FIG. 5, or other reference voltages can be provided.

The operation of the system will now be described in general. An illuminated green light 107 indicates that the fault monitoring system 11 is normal. If the system is activated and changes voltage (as when the chip detector is provided with a path to ground through captured chips), then the warning light 17 comes on and the green light 107 stays on. This indicates the system is operating normally and that the sensor 13 has been activated.

If an open circuit or high resistance fault is present in channel A, the green light 107 goes off and the amber light 89 and the respective warning light 17 come on. The warning light allows the pilot to identify which channel has the fault.

The system can be tested either by pressing the press-to-test button 115 or applying power to the continuity sensor 87. This illuminates all of the lights; the green light 107, the amber light 89 and the warning lights (such as 17) located on the instrument panel. Illumination of all lights indicates that the system is operating normally. If the green light fails to come on during a test, then an open circuit or a high resistance fault is present in one of the channels. Identification in the channel occurs by ending the test (by releasing the press-to-test button and by waiting for the continuity sensor to turn off) so that the normal channels turn off the respective warning lights. This leaves the affected channel warning light 17 on.

If a fault is indicated by the amber and warning lights 89, 17, yet the system tests normally (all lights, including the green light 107 come on), then this indicates that there is a problem with the chip detector 13. The chip detector could be out of its hole (that is the plug is not in electrical contact with its seat) and transmission fluid may be leaking.

In general, the high comparator 61 is ground seeking, changing state from low to high when a ground is present in the channel. Such a ground can be caused due to activation of the test button 115, the presence of chips in the chip detector 13 or by a grounded wire. The low comparator 63 is high seeking, changing state from low to high when an open circuit or high resistance is present in the channel. Such an open circuit or high resistance can be caused by a broken or loose wire, the chip detector coming out of the hole (so that the chip detector no longer makes electrical contact with a ground through the frame) or by the chip detector contacts degrading due to corrosion or coking (thereby causing a decrease in the leakage current through the resistor 51). Resistor 51 is selected so as to provide a suitable known leakage current. Specific changes in the leakage current are detected by the two comparators 61, 63.

Now, the operation of the system will be described more specifically. The green light 107 is illuminated to indicate that the system is normal. In a quiescent state, the outputs of the high and low comparators 61, 63 are low. This drives the output of the NAND gate 97 high, which turns on FET 105 and illuminates the green light 107. Also, FET 111 is held open by the inverter, to keep the amber light 89 off.

To test the system, the press-to-test button 115 is pressed, wherein the green light stays on, and the amber light 89 and the warning lights 17 illuminate. Closure of the press-to-test button provides a ground to the inputs 65, 71. The high comparator 61, which is ground seeking, changes its output 77 to high. This high is input to the AND gate 81. Assuming the other channels are free of faults, all of the other channels also provide high inputs into the AND gate. This causes the AND gate 81 to switch high, which closes FET 87 to illuminate the amber light 89. In addition, the high output 77 of the high comparator 61 switches FET 91 on to illuminate the warning light 17. In fact, all of the warning lights for the other channels are illuminated. Thus, when pressing the press-to-test button 115, all of the lights are illuminated to indicate that the system is in working order. When the press-to-test button is released, the green light 107 stays on and the amber light 89 and the warning lights 17 go off after the continuity sensor 117 turns off.

The same test automatically occurs every time power is first applied to the chip detector 13. Power is applied to the wire 25 by turning on the system, so as to energize the reference voltage supply 69, or by releasing the press-to-test button 115 after it has been pressed. When the power is applied, wire 25 has a high voltage, which activates the continuity sensor 87. This application of power causes the continuity sensor 87 to provide continuity to ground for a predetermined amount of time (for example, 5 to 10 seconds). When continuity is provided, the amber light 89 and the warning light 17 illuminate as when the press-to-test button 115 is pressed. Only those warning lights that are in a circuit with a continuity sensor 87 are illuminated. After the predetermined amount of time has passed, the continuity sensor opens and the amber light and the warning light go off.

If a sufficient amount of chips become lodged in the chip detector 13, or if a wire is shorted to ground, then the warning light 17 illuminates to inform the pilot of an activation of the circuit. The chips in the chip detector provide a path to ground. This ground causes the output 77 of the high comparator 61 to go high. The amber light 89 stays off because only one channel is affected and the AND gate 81 stays low.

The operation of the system when a circuit fault is present will now be described. If there is an open circuit or high resistance in channel A, the system 11 automatically detects this fault. The amber light 89 and the warning light 17 are illuminated, while the green light 107 is turned off. This indicates a fault condition in the channel shown by the specific warning light 17. The low comparator 63 senses the open circuit or high resistance and switches its output 93 high. This illuminates the warning light 17 and also the amber light 89 by way of the NAND gate 97 and the inverter 109. The green light 107 is turned off. This condition will persist until repaired.

When a fault is indicated, the system can be tested by activating the press-to-test button 115. If the fault is between the continuity sensor 87 and the comparators 61, 63, the green light 107 will stay off. This indicates a loose or broken wire in the channel. However, if the green light 107 comes on, this indicates that the circuit to the continuity sensor 87 is operational and that the chip detector is presenting the fault condition. The chip detector 13 is either out of the hole or the chip detector has degraded due to contact corrosion or coking. If the chip detector is out of the hole, the transmission fluid could be leaking, a dangerous possibility.

Figure 6:
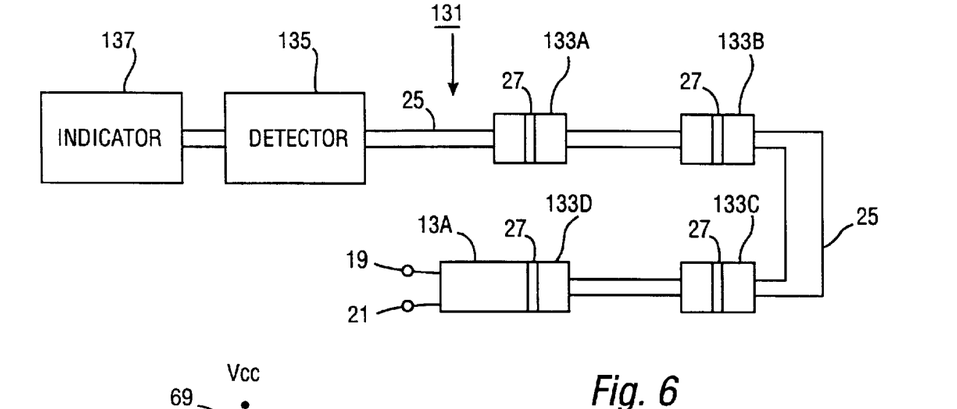
FIG. 6 is a block diagram showing another embodiment of the present invention.

In FIG. 6, there is shown a block diagram of the present invention in accordance with a preferred embodiment. The sensing circuit 131 is similar to the circuit 11 described above, with the exception that plural connectors 133A, 133B, 133C, 133D are provided at various locations along the wire 25. (For convenience, these connectors are labeled as follows: first connector 133A, second connector 133B, third connector 133C, and fourth connector 133D.) For example, in an aircraft, a connector is typically provided where the wire passes through a bulkhead. Thus, the conductors in the wire 25 extend from the detector 135 to the sensor 13 via the plural connectors, including the connector 133D located adjacent to the sensor 13A.

Locating a fault along the wire 25 can be difficult, particularly if the wire 25 extends through inaccessible parts of the aircraft. The present invention enables the fault to be located relative to the connectors.

Each connector is provided with an insert 27. Each insert 27 has a resistive device that is connected across the conductors. As described above, the resistive device can be connected between the two pins in the respective connector, or from a pin to the connector shell.

By providing several paths for energy flow along the length of the circuit 131, the location of an open circuit fault can be determined. For example, if the wire 25 breaks between the third and the fourth connectors 133C and 133D, then no energy flows through the resistive device in the fourth connector 133D. The total energy flowing through the circuit decreases, because current can now only flow through three out of the four paths, as required by the resistive devices of the inserts 27. This decrease in energy flow is detected by the detector 135 (which will be discussed in more detail below). If the wire breaks between the second and third connectors 133B, 133C, then current can flow only through the first and second connectors 133A, 133B and not through the third and fourth connectors 133C, 133D. This drop in current through the circuit is detected by the detector 135. Likewise, if the wire breaks between the first and second connectors 133A, 133B, or between the detector 135 and the first connector 133A, the drop in current will be detected.

The amount that the current drops or decreases depends on the resistance values across the conductors in the connectors, as well as the wire resistance between the connectors. Typically, the wire resistance between the connectors will be negligible. The current drop will be in proportion to these resistances. For example, if the resistive devices in the inserts shown in FIG. 6 are each 10K ohms, then the effective resistance of the resistive devices lumped together would be 2.5K ohms. Thus, when the sensor 13A is open and the circuit is fault-free, the voltage source ($V_0$) inside of the detector 135 has a load of 2.5K ohms.

Suppose that the wire 25 broke between the third and fourth connectors 133C, 133D. Then, the effective resistance of the resistive devices in the remaining connectors 133A, 133B, 133C would be 3.3K ohms. The voltage would drop from ($V_0$) to a value ($V_1$) due to the higher resistance.

Suppose that the wire 25 broke between the second and third connectors 133B, 133C. The effective resistance of the resistive devices in the remaining connectors 133A, 133B would be 5K ohms. The voltage would drop to a value $V_2$ which is less than $V_1$.

Suppose that the wire 25 broke between the first and second connectors 133A, 133B. The effective resistance of the resistive device in the remaining connector 133A would be 10K ohms. The voltage would drop to a value $V_3$ which is less than $V_2$.

If the wire broke between the detector 135 and the first connector 133A, the effective resistance would be infinite because the circuit is open. The voltage would then increase to the unloaded output of the reference voltage supply 69.

By monitoring the voltage level on the wire 25 across the input of the detector 135, the location of the fault (or broken wire) can be determined as being between particular adjacent connectors.

Figure 7:
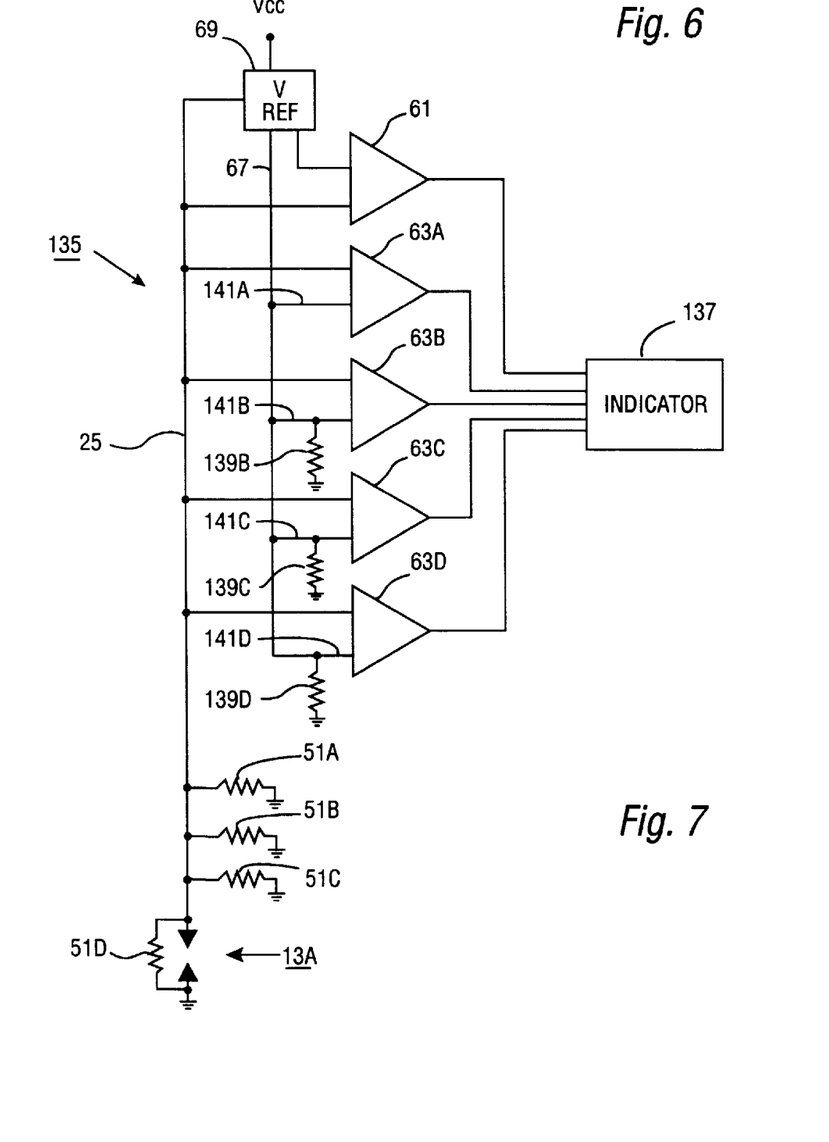
FIG. 7 is an electrical schematic diagram of a detector circuit for use with the embodiment of FIG. 6.

The detector 135 is shown in more detail in FIG. 7. The wire 25 extends from the reference voltage supply 69 to the sensor 13A. The wire could be a single wire as shown in FIG. 7, or a pair of wires as shown in FIG. 6. If a single wire is used, then the return path is provided by the air frame structure as ground. There is a high comparator 61 that changes state from low to high when a ground is present on the wire 25. For example, if the sensor 13A closes, then the high comparator 61 senses this and provides an output to the indicator 137. The high comparator has one input connected to the reference voltage supply 69, and the other input connected to the wire 25. The reference voltage input into the high comparator is set at a predetermined level $V_{ref}$ (e.g. 3–3.5V).

The resistors in each connector 133A, 133B, 133C, 133D are shown respectively as 51A, 51B, 51C, 51D in FIG. 7. There is a low comparator 63A, 63B, 63C, 63D for each voltage level that is to sensed. Each comparator has one input connected to a reference voltage 69 and the other input connected to the wire 25. The reference voltage input into each low comparator is connected to ground by a respective resistor 139B, 139C, 139D. (The first low comparator 63A has no input resistor, because it is set to the open circuit, or unloaded, voltage at the reference supply voltage.) Each of these resistors forms a voltage divider. Thus, the reference voltages provided for the low comparators can be individually set for each low comparator 63A, 63B, 63C, 63D. The reference voltage input 141A for the first low comparator 63A is set to the unloaded voltage output (e.g. 10V). This comparator 63A detects if the wire 25 breaks between the detector and the first connector 133A. The reference voltage input 141B for the second low comparator 63B is set to $V_3$. This comparator 63B detects if the wire 25 breaks between the first and second connectors 133A, 133B. The reference voltage input 141C for the third low comparator 63C is set to $V_2$. This comparator 63C detects if the wire breaks between the second and third connectors 133B, 133C. The reference voltage input 141D for the fourth low comparator 63D is set to $V_1$. This comparator 63D detects if the wire breaks between the third and fourth connectors 133C, 133D.

The output of each of the low comparators 63A, 63B, 63C, 63D and the high comparator 61 is connected to the indicator 137. The indicator 137 can be, for example, a warning light to indicate a closed circuit across the sensor, as well as individual lights for each comparator. By counting the number of individual lights that are illuminated, the relative location of the open circuit fault can be determined. Appropriate switching devices, such as FET's can be provided on the comparator outputs, so as to switch the respective lights on and off.

The values of the resistors 51A, 51B, 51C, 51D can be the same, as discussed in the example above, or then can be different. For example, the resistance could increase in value from the first resistor 51A to the fourth resistor 51D. Differing resistors would be useful to have the voltage drop in more even increments when the wire is broken between connectors, thereby making the detection of the voltage drop easier with the comparators.

The foregoing disclosure and the showings made in the drawings are merely illustrative of the principles of this invention and are not to be interpreted in a limiting sense.

What is claimed is:

1. A method of detecting faults in an electrical sensing circuit, the electrical sensing circuit comprising circuit conductors, the circuit conductors having first and second ends, the electrical circuit also comprising a sensor located at the first end of the circuit conductors, and a connector located along the circuit conductors near the sensor, the connector having connector conductors therein which connector conductors are electrically continuous with the circuit conductors, at least one of the connector conductors comprising a pin, the sensor being a normally open type and comprising contacts, the connector being separate from the contacts, comprising the steps of:

a) providing a leakage current between the connector conductors by providing a resistance contained in an elastomeric medium, the medium being located inside of a shell cavity of the connector, with the pin extending through the medium at a location that makes electrical contact with the resistance;

b) monitoring the leakage current along the circuit conductors and through the connector conductors from the second end of the circuit conductors;

c) detecting if there is a change in the leakage current, and if so, then driving an indicator.

2. The method of claim 1 wherein the step of detecting if there is a change in the leakage current further comprises the step of detecting if the leakage current decreases, and if so, then the step of driving an indicator further comprises the step of driving an open fault indicator.

3. The method of claim 1 wherein the connector comprises two pins, with the leakage current being between the two pins, the two pins being electrically continuous with the respective circuit conductors.

4. The method of claim 1 wherein the sensor comprises a chip detector.

5. The method of claim 1 further comprising the step of detecting if the sensor becomes closed.

6. The method of claim 1, wherein:

a) the step of detecting if there is a change in the leakage current further comprises the step of detecting if the leakage current decreases, and if so, then the step of driving an indicator further comprises the step of driving an open fault indicator;

b) the sensor comprises a chip detector;

c) detecting if the sensor becomes closed.

7. A method of locating a fault in an electric circuit, the circuit comprising circuit conductors that have first and second ends, the circuit having a sensor at the first end, the circuit having first and second connectors spaced apart from each other and along a length of the circuit conductors between the sensor and the second end, with each of the first and second connectors having connector conductors therein which are electrically continuous with the circuit conductors, each of the first and second connectors having at least one connector conductor that comprises a pin, the sensor being a normally open type, comprising the steps of:

a) providing a first resistance between the connector conductors of the first connector and a second resistance between the connector conductors of the second connector;

b) monitoring energy flow through the circuit from the second end of the circuit conductors;

c) detecting if there is a change in the energy flow, and if so, then determining the location of the fault relative to the first and second connectors.

8. The method of claim 7 wherein the step of monitoring energy flow through the circuit further comprises the step of monitoring the voltage across the circuit conductors.

9. The method of claim 7 wherein the step of providing a first resistance and providing a second resistance further comprises providing a first resistance that has a different resistance from the second resistance.

10. The method of claim 7 further comprising the step of detecting if the sensor becomes closed.

11. The method of claim 7, wherein the step of providing a first resistance between the connector conductors of the first connector and a second resistance between the connector conductors of the second connector further comprises the step of providing the first resistance contained in a first elastomeric medium, the first medium being located inside of a shell cavity of the first connector, with the pin of the first connector extending through the medium at a location that makes electrical contact with the first resistance, and providing a second resistance contained in an elastomeric second medium, the second medium being located inside of a shell cavity of the second connector, with the pin of the second connector extending through the second medium at a location that makes electrical contact with the second resistance.

* * * * *